United States Patent
Chen et al.

(10) Patent No.: US 10,727,112 B2
(45) Date of Patent: Jul. 28, 2020

(54) REWIRING METHOD FOR SEMICONDUCTOR

(71) Applicant: SHANGHAI MICRO ELECTRONICS EQUIPMENT (GROUP) CO., LTD., Shanghai (CN)

(72) Inventors: Yonghui Chen, Shanghai (CN); Shiyi Tang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/338,665

(22) PCT Filed: Sep. 28, 2017

(86) PCT No.: PCT/CN2017/103900
§ 371 (c)(1),
(2) Date: Apr. 1, 2019

(87) PCT Pub. No.: WO2018/059474
PCT Pub. Date: Apr. 5, 2018

(65) Prior Publication Data
US 2020/0013670 A1    Jan. 9, 2020

(30) Foreign Application Priority Data
Sep. 30, 2016 (CN) .......................... 2016 1 0874650

(51) Int. Cl.
*H01L 21/768* (2006.01)
*H01L 21/311* (2006.01)
(Continued)

(52) U.S. Cl.
CPC .. *H01L 21/76816* (2013.01); *H01L 21/31144* (2013.01); *H01L 21/76877* (2013.01);
(Continued)

(58) Field of Classification Search
None
See application file for complete search history.

(56) References Cited

U.S. PATENT DOCUMENTS 9,040,316 B1 *  5/2015  Scanlan ............ H01L 21/76879
                                                                    438/15
9,196,509 B2 * 11/2015  Scanlan ................ H01L 23/544
(Continued)

FOREIGN PATENT DOCUMENTS

CN         102332408 A     1/2012
CN         102637608 A     8/2012
(Continued)

OTHER PUBLICATIONS

Cao, Hong-Zhong, et al. "Two-Photon Nanolithography of Positive Photoresist Thin Film with Ultrafast Laser Direct Writing." Applied Physics Letters, vol. 102, No. 20, 2013, p. 201108., doi:10.1063/1.4807678 (Year: 2013).*

*Primary Examiner* — J. E. Schoenholtz
(74) *Attorney, Agent, or Firm* — Muncy, Geissler, Olds & Lowe, P.C.

(57) ABSTRACT

A method for rewiring of semiconductor devices is provided, in which deviations of electrical connection terminals (211, 212, 221, 222, 231, 232) on a carrier (100) are calculated and corrected by forming rewiring structures on the electrical connection terminals by mask-free photolithography. A wiring layer and/or solder balls (700) is/are then formed on the rewiring structures by processing the carrier (100) in a monolithic manner using mask-based photolithography. In this way, the combined use of mask-free photolithography and mask-based photolithography allows for higher efficiency and a shorter process cycle, compared to only using mask-free photolithography.

11 Claims, 10 Drawing Sheets

(51) Int. Cl.
 *H01L 21/66* (2006.01)
 *H01L 23/00* (2006.01)
(52) U.S. Cl.
 CPC .. *H01L 21/76895* (2013.01); *H01L 21/76897* (2013.01); *H01L 22/20* (2013.01); *H01L 24/19* (2013.01); *H01L 2224/04105* (2013.01); *H01L 2224/12105* (2013.01)

(56) References Cited

U.S. PATENT DOCUMENTS

| | | | |
|---|---|---|---|
| 9,543,224 B1 * | 1/2017 | Meyer | H01L 22/20 |
| 10,157,803 B2 * | 12/2018 | Bishop | H01L 21/31 |
| 2010/0073663 A1 | 3/2010 | Meyer | |
| 2011/0198762 A1 | 8/2011 | Scanlan | |
| 2011/0202896 A1 | 8/2011 | Scanlan et al. | |
| 2013/0280826 A1 * | 10/2013 | Scanlan | H01L 23/544 438/15 |
| 2014/0191387 A1 | 7/2014 | Jin et al. | |
| 2016/0189983 A1 | 6/2016 | Shi | |
| 2016/0329257 A1 * | 11/2016 | Scanlan | H01L 21/76879 |
| 2018/0082911 A1 * | 3/2018 | Bishop | H01L 21/31 |

FOREIGN PATENT DOCUMENTS

| | | |
|---|---|---|
| CN | 104838486 A | 8/2015 |
| CN | 105304507 A | 2/2016 |
| WO | WO-2014-071312 A1 | 5/2014 |

\* cited by examiner

REWIRING METHOD FOR SEMICONDUCTOR

TECHNICAL FIELD

The present invention relates to semiconductor technology and, in particular, to a method for rewiring of semiconductor devices.

BACKGROUND

The continuous development of integrated circuit (IC) technology has brought about a trend in electronics toward miniaturization, intelligence, high performance and high reliability. Packaging is critical not only to the performance of individual ICs but to whether the ICs can constitute a compact, low-cost, reliable electronic system. As IC dies continue shrinking in size and increasing in integration, more and more stringent requirements are being placed on IC packaging.

As shown in FIG. 1, fan-out wafer-level packaging (FOWLP) is a packaging technique to rearrange individual dies 2 diced from a wafer on a new carrier 1 for wafer-level packaging. New packages 3 can then be formed on the new carrier 1 using conventional wafer-level packaging techniques (FIG. 2). FIG. 4 depicts a schematic illustration of a single one of the packages. As shown in FIG. 4, the die 2 is embedded in the package 3, and the package 3 further includes solder pads 4 for the die 2 and a rewiring structure which is composed of a lower insulating layer 7, a metal layer 5 and an upper insulating layer 6 and fabricated by processes including photolithography, CVD, PVD, etching and electroplating. Moreover, solder balls 8 at new I/O ports (i.e., electrical connection terminals leading from the metal layer 5) are uniformly distributed on the new package 3. The multiple new packages 3 are arranged on the new carrier 1, forming the structure shown in FIG. 2.

A typical rewiring process in the FOWLP technique includes lithographically defining shapes and positions of the upper insulating layer 6, the metal layer 5 and the lower insulating layer 7 and then forming the insulating layers and the metal layer using CVD, PVD, electroplating and other processes. A mainstay (i.e., mask-based) photolithography process defines the shapes and positions usually by shining light through a proportionally-scaled pattern in a pre-fabricated mask onto photoresist coated on the die to cause a photoreaction therein. However, in mass production applications, a good yield requires the dies to be rearranged with an accuracy of only 7-10 μm (while the photolithography process is required to provide a positioning accuracy of smaller than 5 μm). This makes it difficult for the photolithography process to achieve a high yield and hence unsuitable for mass production.

There is also a mask-free photolithography technique which utilizes a light modulator in lieu of a mask to create a desired pattern. While this technique can solve the problem of inaccurate rearrangement, as shown in FIG. 3, it requires individual fitting calculations for all the areas to be processed throughout the new carrier 1. Therefore, its throughput in each photolithography cycle is extremely low (each cycle takes 2-3 hours) and cannot catch up with the tact time (5-10 minutes) of the existing FOWLP technique.

SUMMARY OF THE INVENTION

In order to solve the above problems, the present invention proposes a method for rewiring of semiconductor devices, which combines the mask-free and mask-based photolithography approaches and is more time-saving and efficient than techniques only employing mask-free photolithography and is more lithographically accurate than those only utilizing mask-free photolithography.

To this end, the proposed method includes the steps of:

1) arranging a carrier for bearing a plurality of semiconductor devices, each of the semiconductor devices having a plurality of electrical connection terminals;

2) measuring positions of the plurality of electrical connection terminals relative to the carrier, and obtaining deviations of the plurality of electrical connection terminals by comparing the measured positions with standard positions of the plurality of electrical connection terminals relative to the carrier;

3) correcting the deviations by forming rewiring structures on the plurality of electrical connection terminals by performing a mask-free photolithography process based on the obtained deviations; and 4) forming a wiring layer and/or solder balls on the rewiring structures by processing the carrier in a monolithic manner by performing a mask-based photolithography process.

Preferably, step 3) may include:

depositing a first dielectric layer;

coating a first photoresist layer on the first dielectric layer;

forming a plurality of first-photoresist patterns in the first photoresist layer by performing the mask-free photolithography process based on the deviations obtained from step 2), wherein each of the plurality of first-photoresist patterns is aligned with a corresponding one of the plurality of electrical connection terminals;

etching the first dielectric layer with the first photoresist layer serving as a mask and thereby forming a plurality of first openings in the first dielectric layer, each of the plurality of first openings exposing a corresponding one of the plurality of electrical connection terminals;

removing the first photoresist layer;

coating a second photoresist layer;

forming a plurality of second-photoresist patterns in the second photoresist layer by performing the mask-free photolithography process based on the deviations, thereby defining areas for the rewiring structures; and filling a metal in the areas to form the rewiring structures.

Preferably, step 4) may include:

depositing a second dielectric layer;

coating a third photoresist layer on the second dielectric layer;

forming a plurality of third-photoresist patterns in the third photoresist layer by performing the mask-based photolithography process, each of the plurality of third-photoresist patterns corresponding to one ball pad;

etching the second dielectric layer with the third photoresist layer serving as a mask and thereby forming a plurality of second openings in the second dielectric layer, each of the plurality of second openings exposing a portion of a corresponding one of the rewiring structures; and forming the solder balls on the exposed portions of the rewiring structures.

Preferably, the areas for the rewiring structures may be defined such that only the rewiring structures are exposed in the plurality of second openings in step 4).

Preferably, the semiconductor devices may be dies.

The present invention further provides another method for rewiring of semiconductor devices, including the steps of:"

arranging a carrier for bearing a plurality of semiconductor devices, each of the semiconductor devices having a plurality of electrical connection terminals;

measuring positions of the plurality of electrical connection terminals relative to the carrier;

obtaining deviations of the plurality of electrical connection terminals by comparing the measured positions with standard positions of the plurality of electrical connection terminals relative to the carrier; and comparing the deviations with a predetermined critical deviation range and forming rewiring structures on the plurality of electrical connection terminals by photolithography based on the comparison, the formation of the rewiring structures including:

processing one(s) of the plurality of electrical connection terminals whose deviation(s) is/are below the critical deviation range by performing a mask-based photolithography process;

processing one(s) of the plurality of electrical connection terminals whose deviation(s) is/are beyond the critical deviation range by performing a mask-free photolithography process; and processing each of one(s) of the plurality of electrical connection terminals whose deviation(s) is/are within the critical deviation range by performing one of the mask-based and mask-free photolithography processes whichever is more frequently employed to process surrounding electrical connection terminals; and forming a wiring layer and/or solder balls on the rewiring structures by processing the carrier in a monolithic manner by performing the mask-based photolithography process.

Preferably, in a X-Y-Z three-dimensional system with two linear directions perpendicular to each other and both parallel to a surface of the carrier respectively as X and Y axes and with a linear direction perpendicular to the surface of the carrier as a Z axis, the deviations include at least one of X-deviations, Y-deviations and $R_Z$-deviations, where $R_Z$ denotes a rotational direction about the Z-axis.

Preferably, forming the rewiring structures may include:

processing one(s) of the plurality of electrical connection terminals whose deviation(s) is/are beyond the critical deviation range by performing the mask-free photolithography process; and processing one(s) of the plurality of electrical connection terminals whose deviation(s) is/are below the critical deviation range by performing the mask-based photolithography process, concurrently with the plurality of electrical connection terminals that have been processed by performing the mask-free photolithography process being shielded;

wherein for each of one(s) of the plurality of electrical connection terminals whose deviation(s) is/are within the critical deviation range, counting a number of neighboring electrical connection terminals surrounding it, and processing it with one of the mask-based and mask-free photolithography processes whichever is to be performed on more than half of the neighboring electrical connection terminals.

Preferably, forming the rewiring structures may include:

processing one(s) of the plurality of electrical connection terminals whose deviation(s) is/are below the critical deviation range by performing the mask-based photolithography process;

processing one(s) of the plurality of electrical connection terminals whose deviation(s) is/are beyond the critical deviation range by performing the mask-free photolithography process, concurrently with the plurality of electrical connection terminals that have been processed by performing the mask-based photolithography process being shielded; and wherein for each of one(s) of the plurality of electrical connection terminals whose deviation(s) is/are within the critical deviation range, counting a number of neighboring electrical connection terminals surrounding it, and processing it with one of the mask-based and mask-free photolithography processes whichever is to be performed on more than half of the neighboring electrical connection terminals.

Preferably, the critical deviation range may be 5-7 μm.

Preferably, the semiconductor devices may be dies.

Compared to the conventional techniques, the present invention offers the advantages as follows. The present invention provides a method for rewiring of semiconductor devices, in which deviations of electrical connection terminals on a carrier are calculated and corrected by forming rewiring structures on the electrical connection terminals by mask-free photolithography. A wiring layer and/or solder balls is/are then formed on the rewiring structures by processing the carrier in a monolithic manner (without taking into account the deviations) using mask-based photolithography. In this way, the combined use of mask-free photolithography and mask-based photolithography allows for higher efficiency and a shorter process cycle, compared to only using mask-free photolithography.

The present invention provides another method for rewiring of semiconductor devices, in which deviations of electrical connection terminals on a carrier are calculated and a critical deviation range is determined such that those of the electrical connection terminals whose deviation are below the critical deviation range are processed by mask-based photolithography and those of the electrical connection terminals whose deviation are beyond the critical deviation range are processed by mask-free photolithography. Additionally, for each of the electrical connection terminals whose deviation lies within the critical deviation range, if more than half the surrounding electrical connection terminals are to be processed by one of the photolithography approaches, the electrical connection terminal will also be processed by this photolithography approach. In this way, higher accuracy can be achieved by applying mask-free photolithography to electrical connection terminals requiring relatively great amounts of correction and mask-free photolithography to those requiring small amounts of correction, while similarly allowing higher efficiency and a shorter process cycle by the combination of mask-free photolithography and mask-based photolithography.

BRIEF DESCRIPTION OF THE DRAWINGS

In FIGS. 1-4: 1—new carrier; 2—die; 3—package; 4—solder pad; 5—metal layer; 6—upper insulating layer; 7—lower insulating layer; 8—solder ball.

In FIGS. 5-28: 100—carrier; 210, 220, 230—dies; 211, 212, 221, 222, 231, 232—electrical connection terminals; 241—corrected electrical connection terminal; 310, 320, 330—protective layers; 311—opening; 410, 420, 430—photoresist; 411, 431—photoresist patterns; 421—metal wiring pattern; 500—metal trace; 600—ball pad; 700—solder ball;

LL—die center axis; UU—package center axis.

DETAILED DESCRIPTION

The above objectives, features and advantages of the present invention will become more apparent from the following detailed description of a few specific embodiments thereof which is to be read in conjunction with the accompanying drawings.

Embodiment 1

Figure 1:
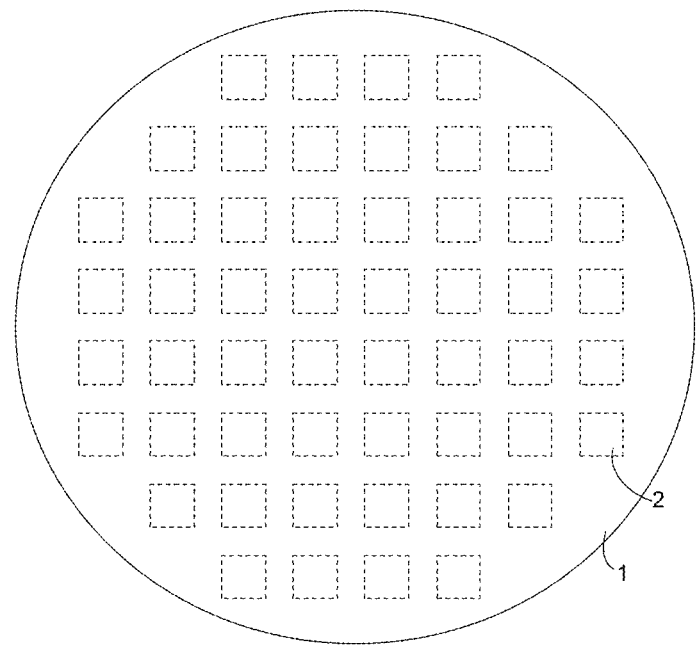
FIGS. 1 and 2 schematically show a conventional fan-out wafer-level packaging (FOWLP) technique.
Figure 2:
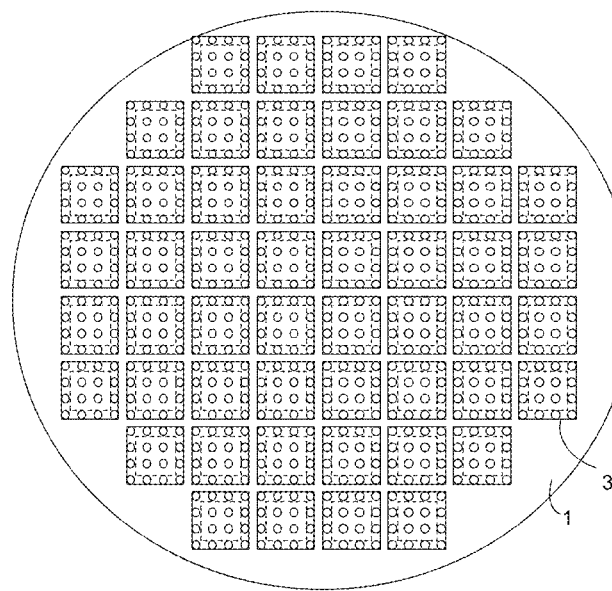
Figure 3:
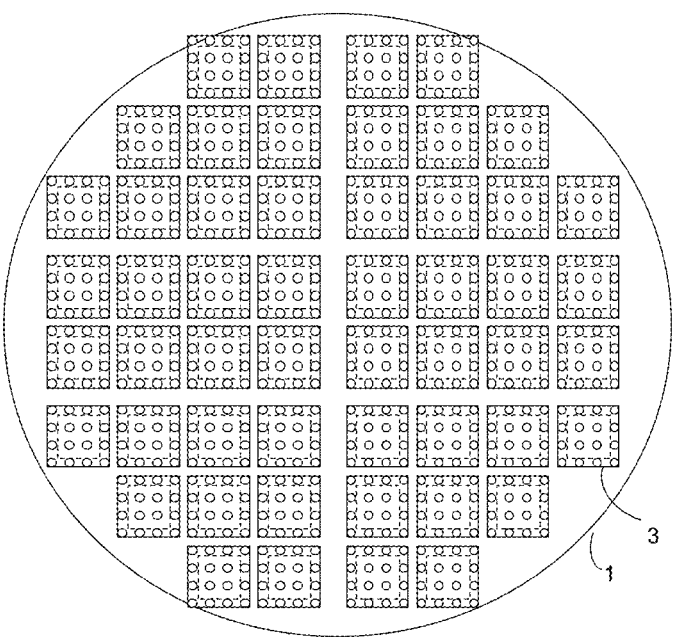
FIG. 3 schematically shows a conventional FOWLP technique employing mask-free photolithography.
Figure 4:
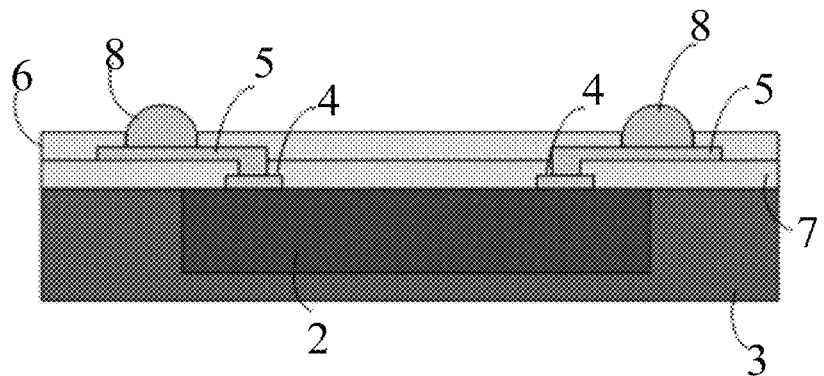
FIG. 4 is a schematic illustration of a single package resulting from the conventional technique.
Figure 5:
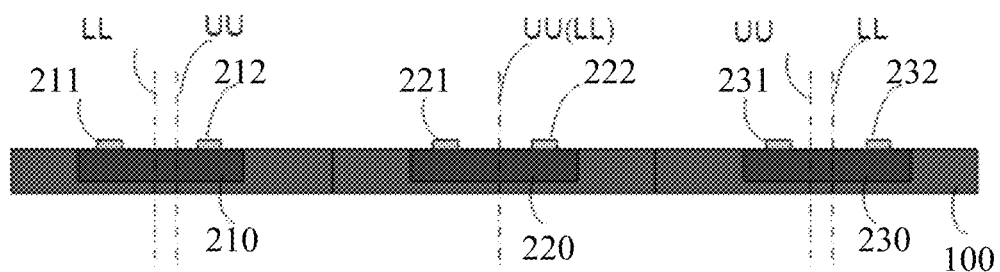
FIG. 5 schematically depicts dies with deviations on a carrier according to a first embodiment of the present invention.

In a first embodiment of the present invention, there is provided a fan-out wafer-level packaging (FOWLP) method, in which, as shown in FIG. 5, dies are rearranged on a carrier 100. FIG. 5 only illustrates three dies 210, 220, 230 arranged horizontally, each having two I/O ports, i.e., two electrical connection terminals. That is, six electrical connection terminals 211, 212, 221, 222, 231, 232 are shown.

Here, an X-Y-Z three-dimensional coordinate system is defined with the horizontal direction as the X-axis, the vertical direction as the Z-axis and the direction perpendicular to the X-Z plane as the Y-axis.

While only three dies 210, 220, 230 are schematically illustrated in FIG. 5, the actual number of the dies arranged on the carrier 100 may be more than three. For each of the dies, standard coordinates of its electrical connection terminals and ball pads are determined in advance based on parameters of a subsequent ball placement process.

However, as can be seen from FIG. 5, the three dies on the carrier 100 may have deviations of different degrees resulting from the previous process. In particular, center axes LL of the dies 210, 230 are shown to deviate significantly (possibly up to 7 μm) from center axes UU of respective packages being fabricated. In this case, the actual coordinates of their electrical connection terminals will shift from the standard coordinates.

For this reason, in order to accurately form the ball pads and thus solder balls just at the standard coordinates, positional correction must be applied to the electrical connection terminals of the three dies prior to the ball placement process. The positional correction may be accomplished by lithographically rewiring the electrical connection terminals to the ball pads that have undergoing position adjustments.

Figure 6:
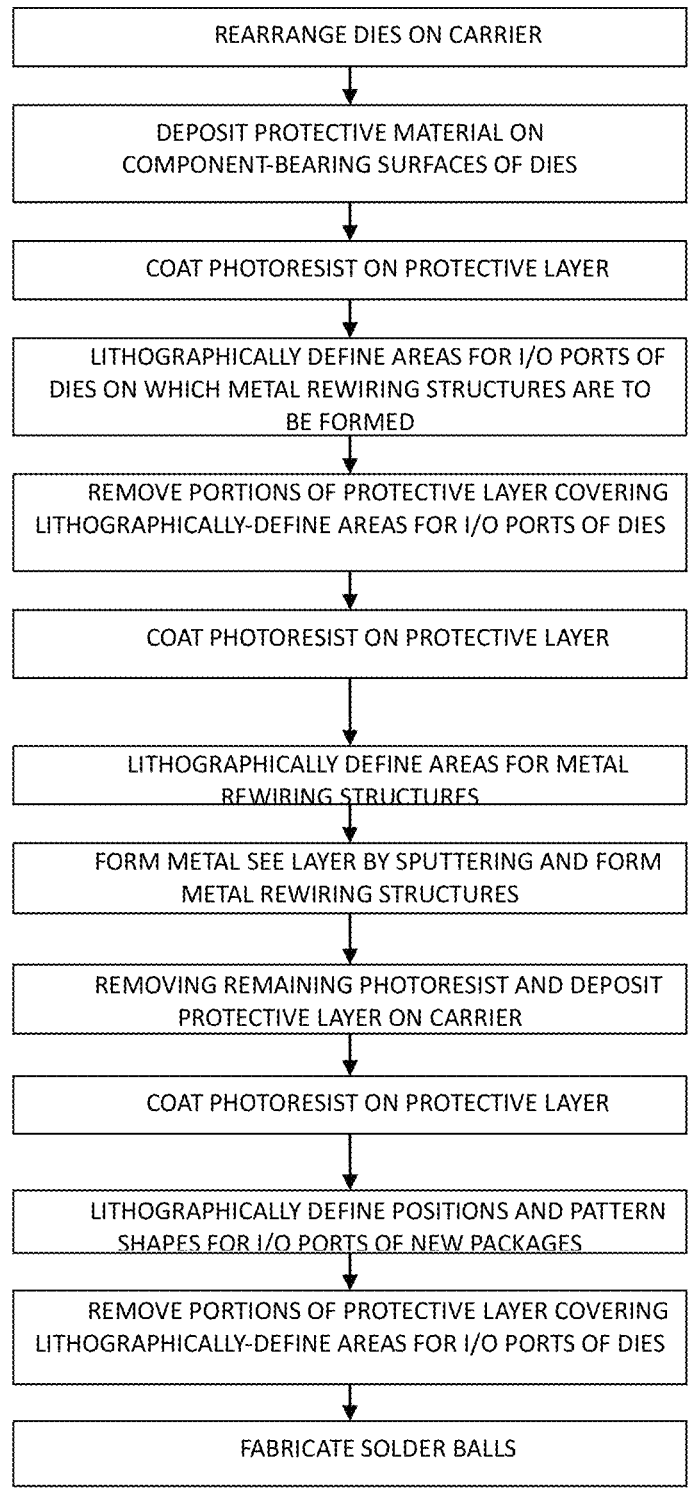
FIG. 6 is a flowchart of a method according to the first embodiment of the present invention.

As shown in FIG. 6, the method may specifically include the following steps.

Figure 7:
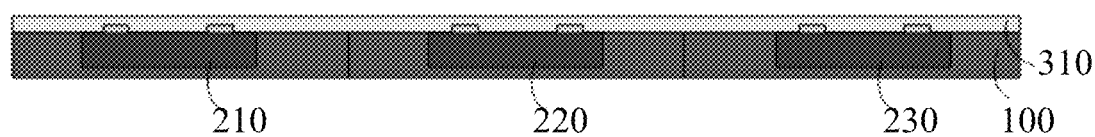
FIG. 7 is a schematic illustration of the first embodiment of the present invention after a protective layer is deposited on the dies.

In step 1.01, the dies that have been rearranged on the carrier 100 are scanned and mapped. Referring to FIG. 7, a protective material is deposited on component-bearing surfaces of the dies, that have been rearranged on the carrier 100, to form a protective layer 310.

The protective material may be selected as a dielectric material or an organic material. The deposition of the protective layer 310 may be accomplished using vapor deposition, oxidation or the like.

Figure 8:
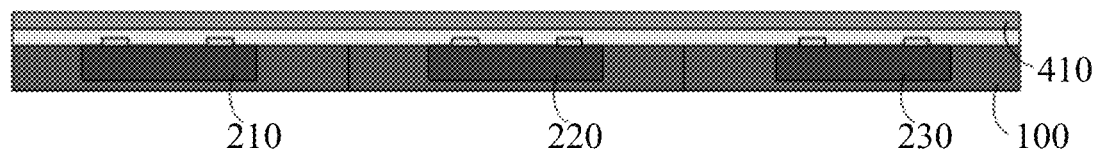
FIG. 8 is a schematic illustration of the first embodiment of the present invention after photoresist is coated on the protective layer.

In step 1.02, with reference to FIG. 8, photoresist 410 is coated on the protective layer 310 deposited in step 1.01.

Figure 9:
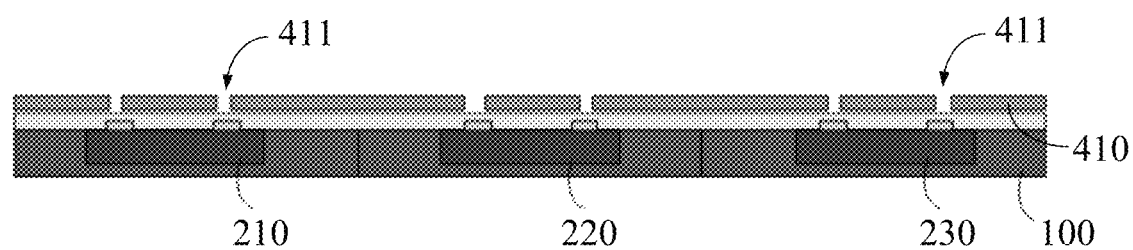
FIG. 9 is a schematic illustration of the first embodiment of the present invention after the photoresist is exposed and developed.

In step 1.03, a mask-free photolithography process is performed to expose portions of the photoresist corresponding to the six electrical connection terminals 211, 212, 221, 222, 231, 232, and rewiring areas for the electrical connection terminals are defined by exposure, development, film-hardening and other necessary photolithography steps, as shown in FIG. 9.

The mask-free photolithography equipment is able to identify the areas to be subjected to lithography by aligning with the dies on the carrier 100 according to a pre-input layout of dies and the pre-defined lithography patterns. After the completion of step 1.03, photoresist patterns 411 aligned with the respective electrical connection terminals are formed in the photoresist 410.

Figure 10:
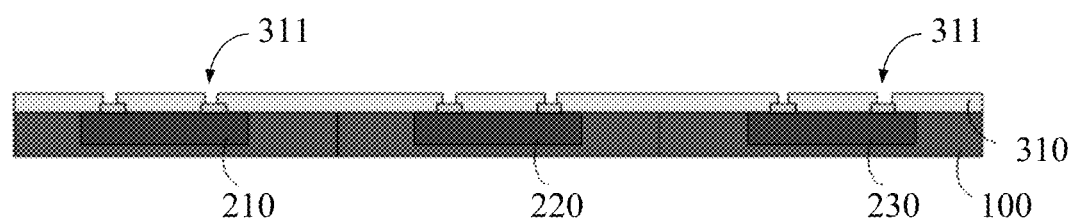
FIG. 10 is a schematic illustration of the first embodiment of the present invention after exposure and development is carried out on the protective layer.

In step 1.04, portions of the protective material covering the electrical connection terminals and underlying the lithographically defined areas in step 1.03 are removed, as shown in FIG. 10.

The protective material may be removed either by a wet etching process or by a dry etching process. After the completion of step 1.04, a plurality of openings 311 are formed in the protective layer 310, each opening 311 corresponding to and exposing at the bottom a corresponding one of the electrical connection terminals so as to allow the electrical connection terminal to be led out by a metal wire.

Figure 11:
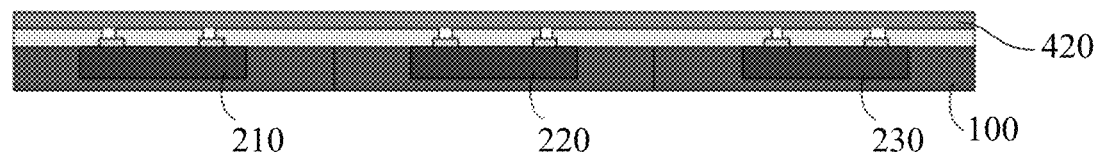
FIG. 11 is a schematic illustration of the first embodiment of the present invention after photoresist is coated on the structure of FIG. 10.

In step 1.05, photoresist 420 is coated on the structure resulting from step 1.04, as shown in FIG. 11.

Figure 12:
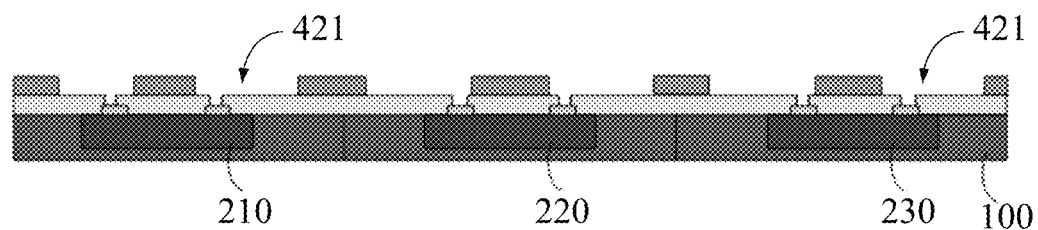
FIG. 12 is a schematic illustration of the first embodiment of the present invention after the photoresist is exposed and developed.

In step 1.06, a mask-free photolithography process is performed to define metal rewiring areas by exposure, development, film-hardening and other necessary photolithography steps. The metal rewiring areas are intended to interconnect the electrical connection terminals of the dies by metal traces whose positions are defined in a unified manner with the carrier 100 as a common reference while being tuned and compensated for based on the positional deviations of the dies. Specifically, corrected metal wiring patterns 421 may be formed based on both deviation-free standard metal wiring patterns and the positional deviations of the dies, as shown in FIG. 12. For example, if the center axis of a die is offset to the left by a certain amount from the center axis of a corresponding package being fabricated, its standard metal wiring pattern may be extended and/or shifted to the right by an amount greater than or equal to the aforementioned offset amount to form the corresponding corrected metal wiring pattern. Similarly, if the center axis of a die is offset to the right by a certain amount from the center axis of a corresponding package being fabricated, its standard metal wiring pattern may be extended and/or shifted to the left by an amount greater than or equal to the aforementioned offset amount to form the corresponding corrected metal wiring pattern. In addition, the corrected metal wiring patterns 421 should expose the openings 311 formed in step 1.04. It will be readily appreciated that that the metal wiring patterns formed in step 1.06 may vary from one another in terms of one or more of shape, size and position. In other words, the metal wiring patterns are distributed irregularly on the carrier 100.

Figure 13:
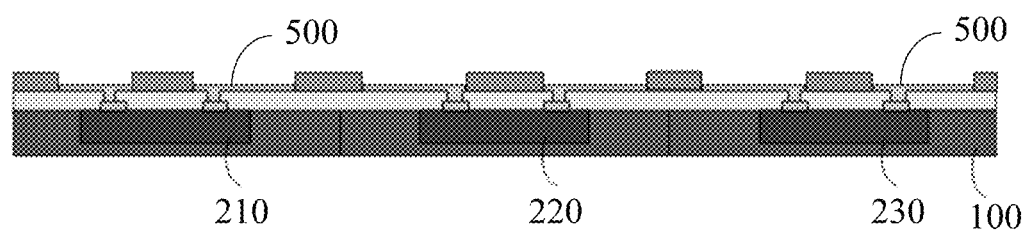
FIG. 13 is a schematic illustration of the first embodiment of the present invention after a metal layer is deposited on the structure of FIG. 12.

In step 1.07, a metal seed layer is formed by sputtering on the structure resulting from step 1.06 and rewiring metal traces 500 are then formed by electroless plating, electroplating or the like, as shown in FIG. 13. The metal traces 500 are configured for subsequent formation of pads on which solder balls are to be placed or subsequent connection to an upper metal layer.

Metals that can be grown include, but are not limited to, copper, aluminum and tungsten. At this point, positional correction for the electrical connection terminals of the dies has been achieved by the metal traces 500. Thus, subsequent wiring and/or ball placement can be accomplished in a monolithic or unified manner based on the standard deviation-free positions of the dies on the carrier 100 without taking into amount their individual deviations.

For example, a ball placement process conducted in such a monolithic manner may include the steps detailed as follows.

Figure 14:
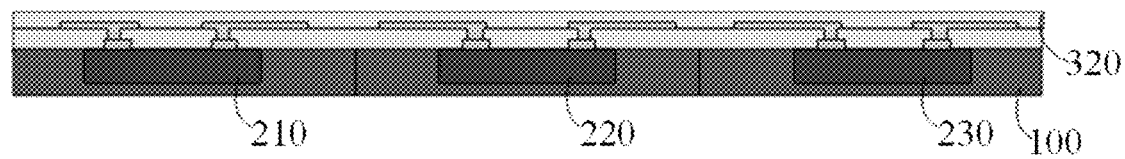
FIG. 14 is a schematic illustration of the first embodiment of the present invention after a protective layer is deposited on the structure of FIG. 13.

In step 1.08, the remainder of the photoresist is removed, followed by deposition of a protective layer 320, as shown in FIG. 14.

The protective material 320 may be selected as a dielectric material or an organic material. The deposition of the protective layer 320 may be accomplished using vapor deposition, oxidation or the like.

Figure 15:
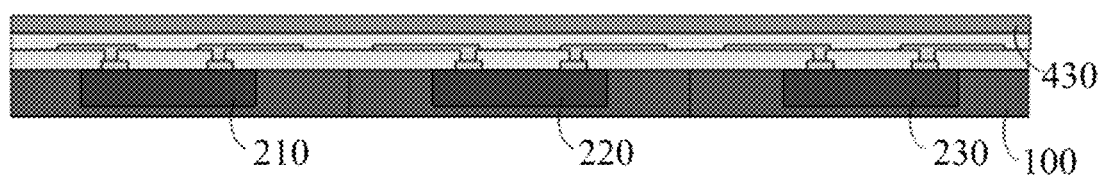
FIG. 15 is a schematic illustration of the first embodiment of the present invention after photoresist is coated on the structure of FIG. 14.

In step 1.09, photoresist 430 is coated on the structure resulting from step 1.08, as shown in FIG. 15.

Figure 16:
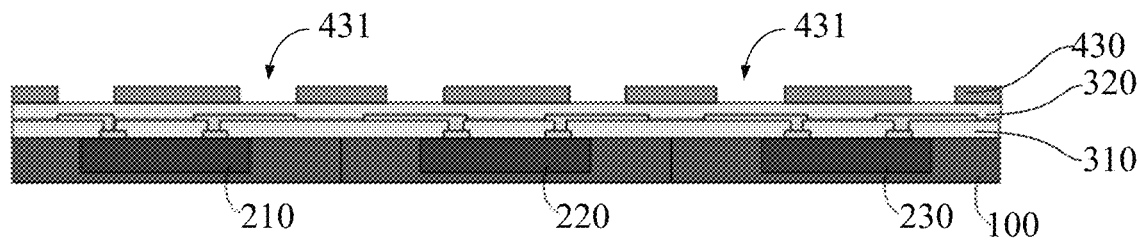
FIG. 16 is a schematic illustration of the first embodiment of the present invention after exposure and development is carried out on the structure of FIG. 15.

In step 1.10, a mask-based photolithography process is preformed to define standard deviation-free positions and patterns for ball pads 600 with the carrier 100 as a common reference and form photoresist patterns 431 in correspondence with the respective metal traces 500, as shown in FIG. 16. It will be readily appreciated that as the photoresist patterns 431 are formed in a monolithic manner in step 1.10, they are regularly distributed over the carrier 100.

Figure 17:
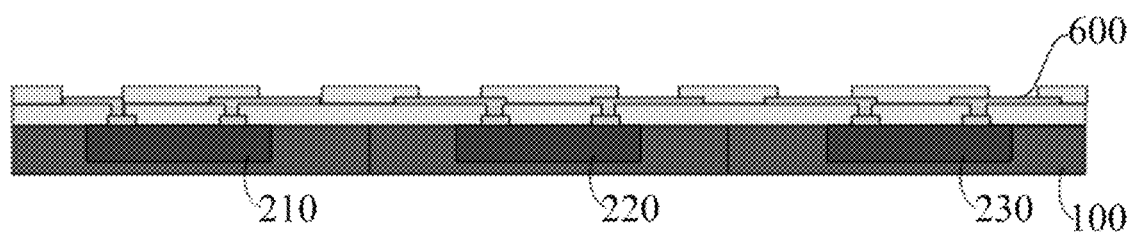
FIG. 17 is a schematic illustration of the first embodiment of the present invention after ball pads are exposed.

In step 1.11, portions of the protective material 320 covered by the lithographically-defined areas for the ball pads 600 are removed, exposing the underlying metal traces 500. The photoresist 430 is then removed so that the exposed portions of the metal traces form the ball pads 600, as shown in FIG. 17.

The removal of the protective material may be accomplished using either a wet etching process or a dry etching process.

Figure 18:
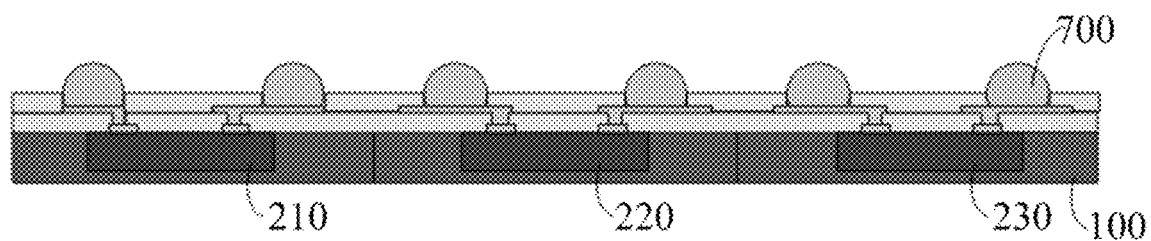
FIG. 18 is a schematic illustration of ball placement according to the first embodiment of the present invention.

In step 1.12, solder balls 700 are fabricated, as shown in FIG. 18.

According to this embodiment, the combination of mask-free photolithography and mask-based photolithography allows for higher efficiency and a shorter process cycle, compared to only using the mask-free photolithography process.

Embodiment 2

In a second embodiment of the present invention, there is provided a fan-out wafer-level packaging (FOWLP) method, in which when there are a relatively small number of dies rearranged on the carrier 100, positions of the dies, that have been rearranged on the carrier 100, are scanned and mapped, and a critical deviation range is determined based on the actual process conditions. In this embodiment, the critical deviation range is determined as 5-7 µm. For example, only dies with deviations beyond the critical deviation range may be processed by mark-free photolithography, while the remaining ones may be processed by mask-based photolithography. In this manner, a significantly enhanced FOWLP throughput can be achieved.

Alternatively, dies with deviations beyond the critical deviation range may be processed by mark-free photolithography, and those with deviations below the critical deviation range may be processed by mask-based photolithography. Additionally, each die with a deviation lying within the critical deviation range may be processed by the approach that is more frequently employed in the surrounding dies. The photolithography scheme, i.e., which die is to be process by which photolithography approach, may be determined in advance. Any die with a deviation lying within the critical deviation range, which is determined to be processed by mask-based photolithography, will be processed together with those with deviations below the critical deviation range. Similarly, any die with a deviation lying within the critical deviation range, which is determined to be processed by mask-free photolithography, will be processed together with those with deviations beyond the critical deviation range.

The order of exposing dies with deviations beyond or below the critical deviation range is not limited. For example, the dies with deviations beyond the critical deviation range as well as applicable ones of the dies with deviations lying within the critical deviation range may be first processed by mask-free photolithography, and all the remaining dies are then processed by mask-based photolithography concurrently with the processed ones being shielded and protected. Alternatively, the dies with deviations below the critical deviation range as well as applicable ones of the dies with deviations lying within the critical deviation range may be first processed by mask-based photolithography, and all the remaining dies are then processed by mask-free photolithography concurrently with the processed ones being shielded and protected.

Figure 19:
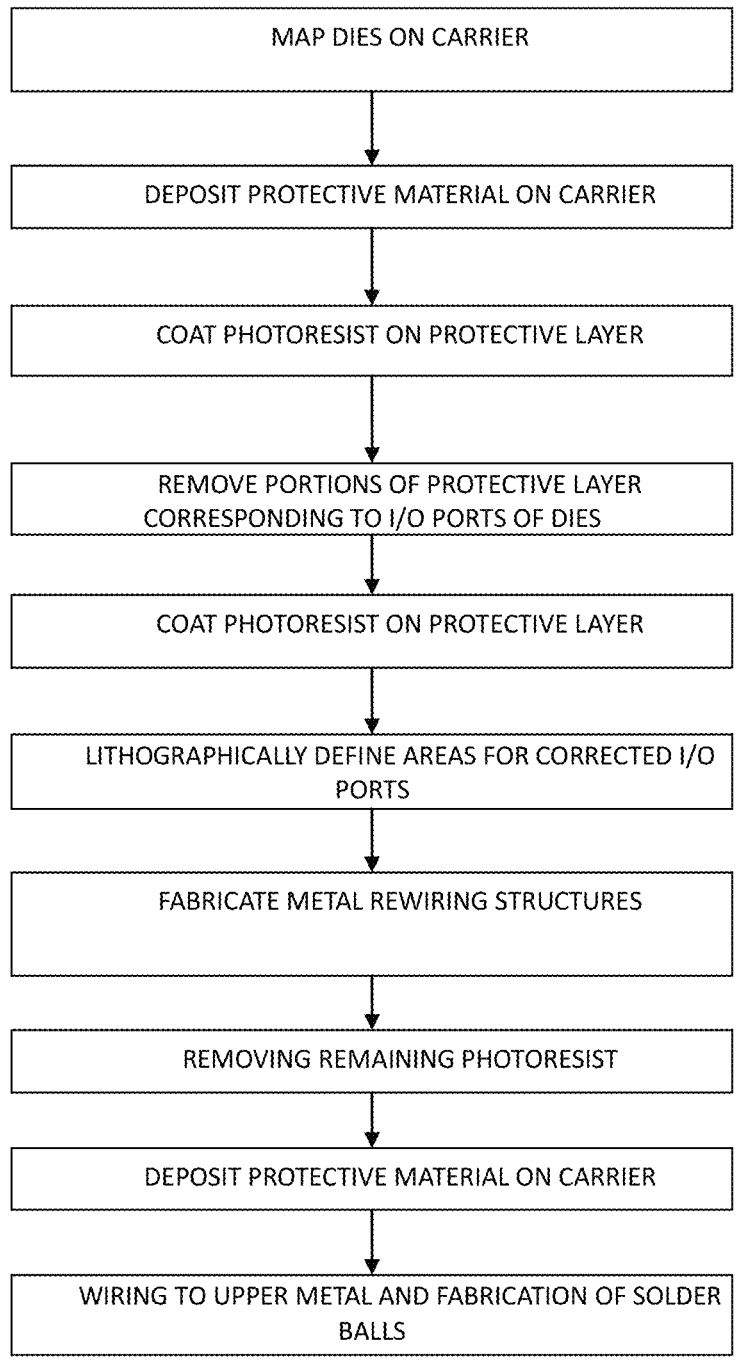
FIG. 19 is a flowchart of a method according to a second embodiment of the present invention.

As shown in FIG. 19, the method may specifically include the following steps.

In step 2.01, the dies on the carrier 100 are scanned and mapped.

Figure 20:
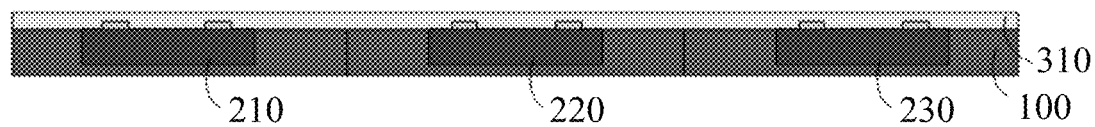
FIG. 20 is a schematic illustration of the second embodiment of the present invention after a protective layer is deposited on dies.

In step 2.02, a protective material is deposited on component-bearing surfaces of the dies, that have been rearranged on the carrier 100, to form a protective layer 310, as shown in FIG. 20.

The material for the protective layer may be selected as a dielectric material or an organic material. The deposition of the protective layer 310 may be accomplished using vapor deposition, oxidation or the like.

Figure 21:
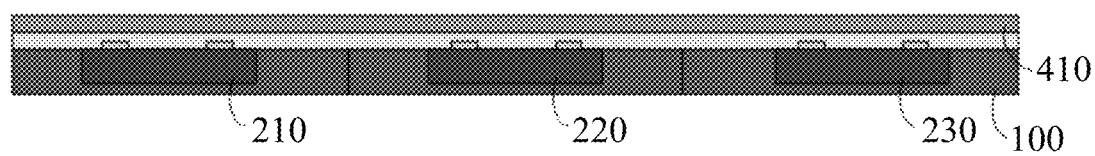
FIG. 21 is a schematic illustration of the second embodiment of the present invention after photoresist is coated on the structure of FIG. 20.

In step 2.03, with reference to FIG. 21, photoresist 410 is coated on the structure resulting from step 2.02.

Figure 22:
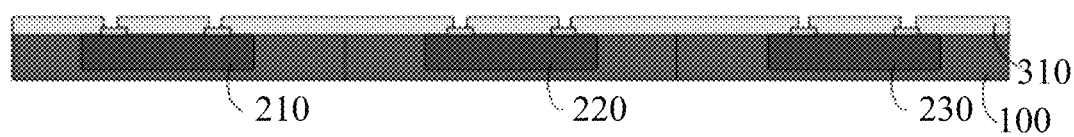
FIG. 22 is a schematic illustration of the second embodiment of the present invention after electrical connection terminals are exposed by lithographically processing the protective layer.

In step 2.04, with an X-Y-Z three-dimensional coordinate system defined with the horizontal direction as the X-axis, the vertical direction as the Z-axis and the direction perpendicular to the X-Z plane as the Y-axis, deviations are categorized into X-deviations, Y-deviations and $R_Z$-deviations, wherein $R_Z$ refers to a rotational direction about the Z-axis. Dies whose electrical connection terminals are associated with any of the above kinds of deviations beyond the critical deviation range are processed by mask-free photolithography. Each die whose electrical connection terminals are associated with any of the above kinds of deviations below the critical deviation range are processed by mask-based photolithography. Die whose electrical connection terminals are associated with any of the above kinds of deviations. Any die with a deviation lying within the critical deviation range is processed by the approach that is more frequently employed in the surrounding dies. Portions of the protective layer 310 corresponding to the electrical connection terminals are then removed, as shown in FIG. 22.

The order of conducting the mask-free photolithography and the mask-based photolithography is not limited. For example, the dies with deviations beyond the critical deviation range and applicable ones of the dies with deviations lying within the critical deviation range may be first processed by mask-free photolithography, and all the remaining dies are then processed by mask-based photolithography concurrently with the processed ones being shielded and protected. Alternatively, the dies with deviations below the critical deviation range and applicable ones of the dies with deviations lying within the critical deviation range may be first processed by mask-based photolithography, and all the remaining dies are then processed by mask-free photolithography concurrently with the processed ones being shielded and protected.

The removal of the protective material may be accomplished using either a wet etching process or a dry etching process.

Processing any die with a deviation lying within the critical deviation range by the photolithography approach that is more frequently employed in the surrounding dies may include: counting the number of the surrounding dies; and processing the die by the photolithography approach that is employed to process more than half the surrounding dies. For example, if a die with a deviation lying within the critical deviation range is surrounded with eight neighboring dies, more than half of which are to be processed by mask-free photolithography, then the die is also to be processed by mask-free photolithography. Otherwise, if more than half of the eight neighboring dies are to be processed by mask-based photolithography, then the die is also to be processed by this photolithography approach. Further, if four of the eight neighboring dies are to be processed by mask-based photolithography and the remaining four neighboring dies are to be processed by mask-free photolithography, the die may be processed by either of these two approaches.

Figure 23:
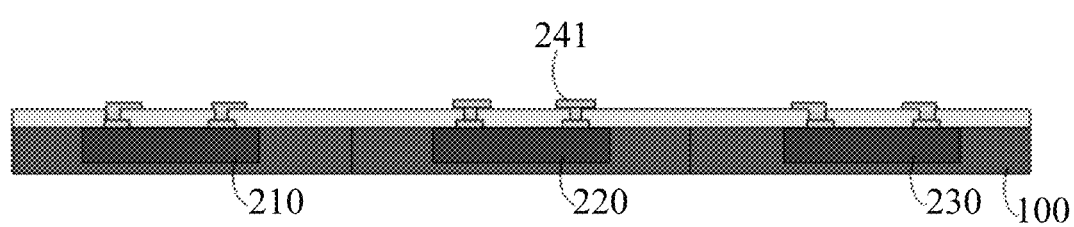
FIG. 23 is a schematic illustration of the second embodiment of the present invention after conductive traces are formed from a metal seed layer deposited on the structure of FIG. 22.

In step 2.05, with similarity to steps 1.05-1.06 in Embodiment 1, photoresist is utilized to define corrected positions for the electrical connection terminals, and as shown in FIG. 23, corrected electrical connection terminals 241 are then formed by processing a metal seed layer formed by sputtering with electroless plating, electroplating or a similar approach. As can be seen from FIG. 23, the corrected electrical connection terminals 241 are positionally consistent with the respective packages being fabricated but not with the respective dies. In this manner, the positional deviations of the dies are corrected by positional correction of the corrected electrical connection terminals 241. Furthermore, the corrected electrical connection terminals 241 are properly interconnected.

At this point, the positional deviations of the dies are corrected by positional correction of the corrected electrical connection terminals 241. Thus, subsequent wiring and/or ball placement can be accomplished in a monolithic manner. The monolithic manner can be understood as a unified manner which is based on the standard deviation-free positions of the dies on the carrier 100 without taking into amount their individual deviations.

For example, a wiring and ball placement process conducted in such a monolithic manner may include the steps detailed as follows.

Figure 24:
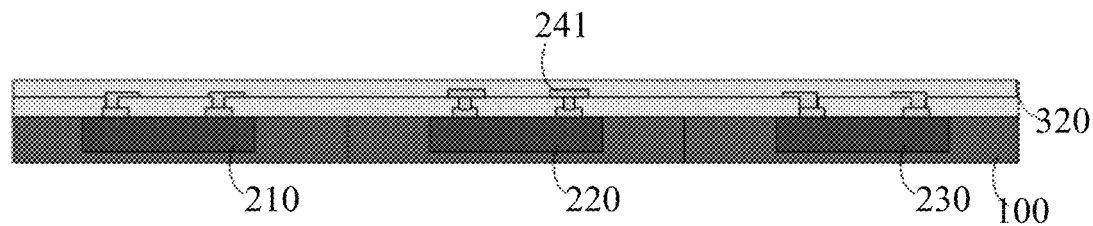
FIG. 24 is a schematic illustration of the second embodiment of the present invention after a protective layer is deposited on the structure of FIG. 23.

In step 2.06, a protective layer 320 is deposited on the structure resulting from step 2.05, as shown in FIG. 24.

Figure 25:
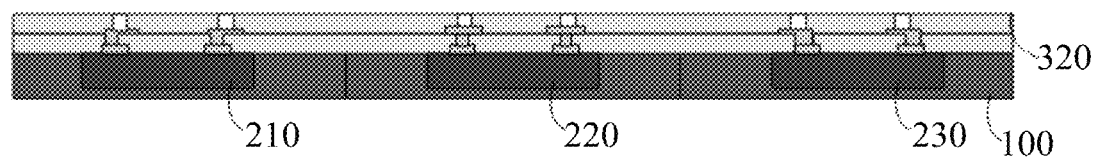
FIG. 25 is a schematic illustration of the second embodiment of the present invention after the conductive traces are exposed.

In step 2.07, areas of the corrected electrical connection terminals 241 are defined by mask-based photolithography, and portions of the protective layer 320 overlying these areas are removed, as shown in FIG. 25.

Figure 26:
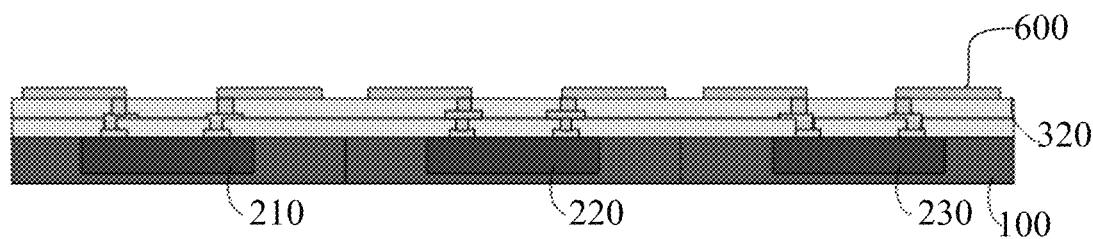
FIG. 26 is a schematic illustration of the second embodiment of the present invention after ball pads are formed.

In step 2.08, a mask-based photolithography process is performed to define metal wiring areas. A metal seed layer is formed by sputtering and then processed by electroless plating, electroplating or the like to form metal traces, as shown in FIG. 26. It will be readily appreciated that since the metal traces are formed in a monolithic manner in step 2.08, they are regularly distributed over the carrier 100.

Metals that can be grown include, but are not limited to, copper, aluminum and tungsten.

Figure 27:
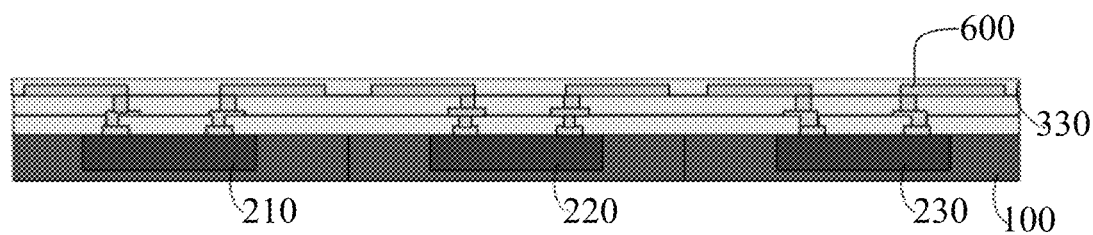
FIG. 27 is a schematic illustration of the second embodiment of the present invention after a protective layer is deposited on the ball pads.

In step 2.09, a protective layer 330 is deposited on the structure resulting from step 2.08, as shown in FIG. 27.

The material for the protective layer may be selected as a dielectric material or an organic material. The deposition of the protective layer 330 may be accomplished using vapor deposition, oxidation or the like.

Figure 28:
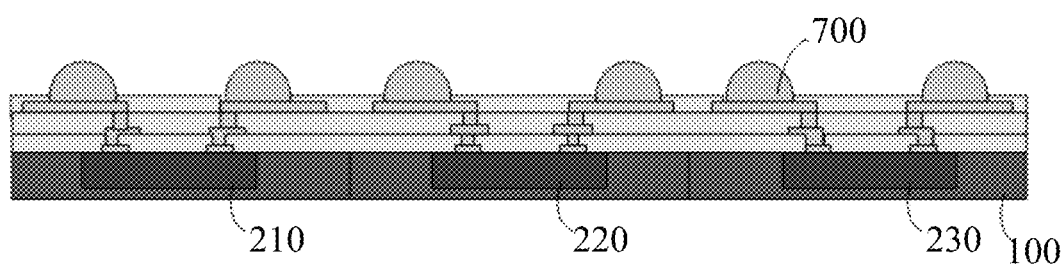
FIG. 28 is a schematic illustration of the second embodiment of the present invention after the structure of FIG. 27 is lithographically processed and formed with solder balls.

In step 2.10, a mask-based photolithography process is preformed to define standard deviation-free positions and shapes for ball pads 600, and the protective layer 330 is partially removed to expose portions of the metal traces as the ball pads 600. Finally, solder balls 700 are formed on the ball pads 600, as shown in FIG. 28.

According to this embodiment, better combination of mask-free photolithography and mask-based photolithography is realized by processing dies of different types selectively using these photolithography approaches, resulting in an additional increase in efficiency and time savings.

While the present invention has been described above with reference to the foregoing embodiments, it is not intended to be limited to these embodiments in any sense. For example, the carrier 100 may support other semiconductor devices with electrical connection terminals than the dies. It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A method for rewiring of semiconductor devices, comprising the steps of:
   1) arranging a carrier for bearing a plurality of semiconductor devices, each of the semiconductor devices having a plurality of electrical connection terminals;
   2) measuring positions of the plurality of electrical connection terminals relative to the carrier, and obtaining deviations of the plurality of electrical connection terminals by comparing the measured positions with standard positions of the plurality of electrical connection terminals relative to the carrier;
   3) forming corrected rewiring structures on the plurality of electrical connection terminals by performing a mask-free photolithography process based on the obtained deviations and deviation-free standard wiring patterns of the semiconductor devices; and
   4) forming a wiring layer and/or solder balls on the corrected rewiring structures by performing a mask-based photolithography process in a unified manner based on deviation-free standard positions of the semiconductor devices on the carrier.

2. The method for rewiring of semiconductor devices of claim 1, wherein step 3) comprises:
   depositing a first dielectric layer;
   coating a first photoresist layer on the first dielectric layer;
   forming a plurality of first-photoresist patterns in the first photoresist layer by performing the mask-free photolithography process based on the deviations obtained from step 2), wherein each of the plurality of first-photoresist patterns is aligned with a corresponding one of the plurality of electrical connection terminals;
   etching the first dielectric layer with the first photoresist layer serving as a mask and thereby forming a plurality of first openings in the first dielectric layer, each of the plurality of first openings exposing a corresponding one of the plurality of electrical connection terminals;
   removing the first photoresist layer;
   coating a second photoresist layer;
   forming a plurality of second-photoresist patterns in the second photoresist layer by performing the mask-free photolithography process based on the deviations and the deviation-free standard wiring patterns of the semiconductor devices, thereby defining corrected areas for the rewiring structures; and
   filling a metal in the corrected areas to form the rewiring structures.

3. The method for rewiring of semiconductor devices of claim 2, wherein step 4) comprises:
   depositing a second dielectric layer;
   coating a third photoresist layer on the second dielectric layer;
   forming a plurality of third-photoresist patterns in the third photoresist layer by performing the mask-based photolithography process, each of the plurality of third-photoresist patterns corresponding to one ball pad;
   etching the second dielectric layer with the third photoresist layer serving as a mask and thereby forming a plurality of second openings in the second dielectric layer, each of the plurality of second openings exposing a portion of a corresponding one of the rewiring structures; and
   forming the solder balls on the exposed portions of the rewiring structures.

4. The method for rewiring of semiconductor devices of claim 3, wherein the areas for the rewiring structures are defined such that only the rewiring structures are exposed in the plurality of second openings in step 4).

5. The method for rewiring of semiconductor devices of claim 1, wherein the semiconductor devices are dies.

6. A method for rewiring of semiconductor devices, comprising the steps of:
   arranging a carrier for bearing a plurality of semiconductor devices, each of the semiconductor devices having a plurality of electrical connection terminals;
   measuring positions of the plurality of electrical connection terminals relative to the carrier;
   obtaining deviations of the plurality of electrical connection terminals by comparing the measured positions with standard positions of the plurality of electrical connection terminals relative to the carrier; and
   comparing the deviations with a predetermined critical deviation range and forming corrected rewiring structures on the plurality of electrical connection terminals by photolithography based on the comparison and based on deviation-free standard wiring patterns of the semiconductor devices, wherein forming the rewiring structures comprises:
   processing one(s) of the plurality of electrical connection terminals whose deviation(s) is/are below the critical deviation range by performing a mask-based photolithography process;
   processing one(s) of the plurality of electrical connection terminals whose deviation(s) is/are beyond the critical deviation range by performing a mask-free photolithography process; and
   processing each of one(s) of the plurality of electrical connection terminals whose deviation(s) is/are within the critical deviation range by performing one of the mask-based and mask-free photolithography processes whichever is more frequently employed to process surrounding electrical connection terminals; and
   forming a wiring layer and/or solder balls on the corrected rewiring structures by performing the mask-based photolithography process in a unified manner based on deviation-free standard wiring patterns of the semiconductor devices on the carrier.

7. The method for rewiring of semiconductor devices of claim 6, wherein in a X-Y-Z three-dimensional system with two linear directions perpendicular to each other and both parallel to a surface of the carrier respectively as X and Y axes and with a linear direction perpendicular to the surface of the carrier as a Z axis, the deviations comprise at least one of X-deviations, Y-deviations and RZ-deviations, where RZ denotes a rotational direction about the Z-axis.

8. The method for rewiring of semiconductor devices of claim 6, wherein forming the rewiring structures comprises:
processing one(s) of the plurality of electrical connection terminals whose deviation(s) is/are beyond the critical deviation range by performing the mask-free photolithography process; and
processing one(s) of the plurality of electrical connection terminals whose deviation(s) is/are below the critical deviation range by performing the mask-based photolithography process, concurrently with the plurality of electrical connection terminals that have been processed by performing the mask-free photolithography process being shielded;
wherein for each of one(s) of the plurality of electrical connection terminals whose deviation(s) is/are within the critical deviation range, counting a number of neighboring electrical connection terminals to be treated by the mask-based photolithography process and a number of neighboring electrical connection terminals to be treated by the mask-free photolithography process, and performing the mask-based photolithography process if the number of neighboring electrical connection terminals to be treated by the mask-based photolithography process is greater than the number of neighboring electrical connection terminals to be treated by the mask-free photolithography process, or performing the mask-free photolithography process if the number of neighboring electrical connection terminals to be treated by the mask-based photolithography process is smaller than the number of neighboring electrical connection terminals to be treated by the mask-free photolithography process.

9. The method for rewiring of semiconductor devices of claim 6, wherein forming the rewiring structures comprises:
processing one(s) of the plurality of electrical connection terminals whose deviation(s) is/are below the critical deviation range by performing the mask-based photolithography process; processing one(s) of the plurality of electrical connection terminals whose deviation(s) is/are beyond the critical deviation range by performing the mask-free photolithography process,
concurrently with the plurality of electrical connection terminals that have been processed by performing the mask-based photolithography process being shielded; and
wherein for each of one(s) of the plurality of electrical connection terminals whose deviation(s) is/are within the critical deviation range, counting a number of neighboring electrical connection terminals be treated by the mask-based photolithography process and a number of neighboring electrical connection terminals to be treated by the mask-free photolithography process, and performing the mask-based photolithography process if the number of neighboring electrical connection terminals to be treated by the mask-based photolithography process is greater than the number of neighboring electrical connection terminals to be treated by the mask-free photolithography process, or performing the mask-free photolithography process if the number of neighboring electrical connection terminals to be treated by the mask-based photolithography process is smaller than the number of neighboring electrical connection terminals to be treated by the mask-free photolithography process.

10. The method for rewiring of semiconductor devices of claim 6, wherein the critical deviation range is from 5 μm to 7 μm.

11. The method for rewiring of semiconductor devices of claim 6, wherein the semiconductor devices are dies.

* * * * *